United States Patent
Kobayashi et al.

(10) Patent No.: US 11,035,747 B2
(45) Date of Patent: Jun. 15, 2021

(54) PRESSURE DETECTION APPARATUS AND ELECTRIC HYDRAULIC PUMP THAT HOUSES PRESSURE DETECTION APPARATUS

(71) Applicant: Nidec Tosok Corporation, Zama (JP)

(72) Inventors: Yoshiyuki Kobayashi, Zama (JP);
Shigehiro Kataoka, Zama (JP);
Yoshihiro Kamimura, Nagaoka (JP)

(73) Assignee: Nidec Tosok Corporation, Kanagawa (JP)

(*) Notice: Subject to any disclaimer, the term of this patent is extended or adjusted under 35 U.S.C. 154(b) by 388 days.

(21) Appl. No.: 16/303,679

(22) PCT Filed: May 24, 2017

(86) PCT No.: PCT/JP2017/019420
§ 371 (c)(1),
(2) Date: Nov. 21, 2018

(87) PCT Pub. No.: WO2017/204261
PCT Pub. Date: Nov. 30, 2017

(65) Prior Publication Data
US 2020/0319048 A1 Oct. 8, 2020

(30) Foreign Application Priority Data
May 24, 2016 (JP) .............................. JP2016-103562

(51) Int. Cl.
*G01L 9/06* (2006.01)
*G01L 19/14* (2006.01)
(Continued)

(52) U.S. Cl.
CPC ................ *G01L 9/04* (2013.01); *F04B 53/00* (2013.01); *G01L 19/14* (2013.01)

(58) Field of Classification Search
CPC ..... G01L 9/00–08; G01L 19/00; G01L 19/14; F04B 53/00
See application file for complete search history.

(56) References Cited

U.S. PATENT DOCUMENTS 8,272,272 B2 9/2012 Gebauer et al.
8,969,978 B2 * 3/2015 Otte .................... G01L 19/0627
257/415
(Continued)

FOREIGN PATENT DOCUMENTS

DE 101 07 814 A1 5/2002
JP 02189435 A * 7/1990 ........... G01L 9/0075
(Continued)

OTHER PUBLICATIONS

Official Communication issued in International Patent Application No. PCT/JP20171019420, dated Aug. 15, 2017.

Primary Examiner — Nguyen Q. Ha
(74) Attorney, Agent, or Firm — Keating & Bennett

(57) ABSTRACT

A pressure detection apparatus includes a base plate including a first surface, a second surface, and an opening, a pressure sensor disposed on the first surface so as to cover the opening of the base plate and outputting an electric signal according to a pressure of measured fluid inside the opening, a lead terminal electrically connected to the pressure sensor, a housing holding the base plate and the lead terminal and including an exposed portion in which a portion of the lead terminal is exposed, and a capacitor protecting the pressure sensor. The housing includes a capacitor housing portion, the capacitor being electrically connected to the lead terminal inside the exposed portion, and a positioning portion that positions, inside the capacitor housing portion, the capacitor that has been mounted in the capacitor housing portion.

6 Claims, 5 Drawing Sheets

(51) Int. Cl.
*G01L 9/04* (2006.01)
*F04B 53/00* (2006.01)

(56) References Cited

U.S. PATENT DOCUMENTS

| | | | |
|---|---|---|---|
| 9,006,847 B2 * | 4/2015 | Welter | G01L 19/0627 |
| | | | 257/417 |
| 2008/0034877 A1 | 2/2008 | Fessele et al. | |
| 2016/0076960 A1 * | 3/2016 | Sato | B21J 5/08 |
| | | | 73/723 |
| 2018/0313709 A1 * | 11/2018 | Chiou | G01L 19/141 |

FOREIGN PATENT DOCUMENTS

| | | |
|---|---|---|
| JP | 2002-257663 A | 9/2002 |
| JP | 4090395 B2 | 5/2008 |
| JP | 2014-211391 A | 11/2014 |

\* cited by examiner

PRESSURE DETECTION APPARATUS AND ELECTRIC HYDRAULIC PUMP THAT HOUSES PRESSURE DETECTION APPARATUS

BACKGROUND OF THE INVENTION

1. Field of the Invention

The present invention relates to a pressure detection apparatus and an electric hydraulic pump that houses the pressure detection apparatus.

2. Description of the Related Art

A pressure detection apparatus that employs a semiconductor pressure sensor is used to measure a pressure of fluid such as gas and liquid. Japanese Unexamined Patent Application Publication No. 2002-257663 discloses a pressure detection apparatus including a metal base plate provided with a pressure introduction port, a pressure sensor that receives a fluid pressure through the pressure introduction port of the base plate, a circuit board connected to the pressure sensor by wire bonding, and a capacitor that obtains yield strength of the semiconductor pressure sensor mounted on the circuit board against exogenous noise.

In the pressure detection apparatus disclosed in Japanese Unexamined Patent Application Publication No. 2002-257663, since the capacitor mounted on the circuit board is connected between an electrode terminal for power supply and an electric terminal for grounding, and between an electrode terminal for output and an electrode terminal for grounding, a circuit board is needed and problems such as the house space and the number of parts becoming large accordingly and increase in the size of the pressure detection apparatus occur.

Recently, consideration of housing such a pressure detection apparatus inside an electric hydraulic pump in which a pump body driven by a motor and a rotating shaft of the motor is accommodated in a case has been made; however, when the pressure detection apparatus becomes large in size, the electric hydraulic pump itself becomes large in size, and a problem such as restriction in the pump installation site occur.

SUMMARY OF THE INVENTION

A pressure detection apparatus of an exemplary embodiment of the present disclosure includes a base plate including a first surface, and a second surface positioned on a back side of the first surface in a vertical direction. The pressure detection apparatus includes the base plate provided with an opening; a pressure sensor disposed on the first surface so as to cover the opening of the base plate, the pressure sensor outputting an electric signal according to a pressure of measured fluid inside the opening; a lead terminal electrically connected to the pressure sensor; a housing that holds the base plate and the lead terminal, the housing including an exposed portion in which a portion of the lead terminal is exposed; and a capacitor that protects the pressure sensor. The housing includes a capacitor housing portion in which the capacitor is mountable, the capacitor that has been mounted being electrically connected to the lead terminal inside the exposed portion, and a positioning portion that positions, inside the capacitor housing portion, the capacitor that has been mounted in the capacitor housing portion. An electric hydraulic pump housing a pressure detection apparatus according to an exemplary embodiment of the present disclosure includes a motor including a rotating shaft; a pump body driven by the motor; the pressure detection apparatus that is in communication with a sensor flow path of the pump body and that is fixed to the pump body; and a case body that houses the motor, the pump body, and the pressure detection apparatus.

Exemplary embodiments of the present invention achieves a reduced number of parts and reduced size.

The above and other elements, features, steps, characteristics and advantages of the present disclosure will become more apparent from the following detailed description of the preferred embodiments with reference to the attached drawings.

DETAILED DESCRIPTION OF THE PREFERRED EMBODIMENTS

Figure 1:
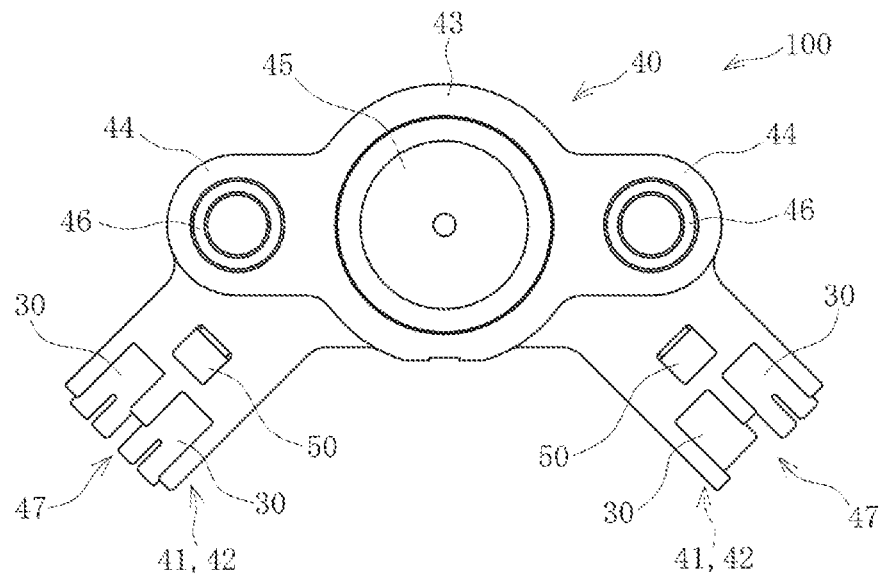
FIG. 1 is a plan view of an exemplary embodiment of a pressure detection apparatus of the present invention.

Hereinafter, a pressure detection apparatus according to the description of the embodiments, and an electric hydraulic pump in which the pressure detection apparatus is housed will be described with reference to the drawings.

A pressure detection apparatus 100 of the present disclosure is configured to include a base plate 10 including a first surface 11, a second surface 12 positioned on a back side of the first surface 11 in a vertical direction, and an opening 13; a pressure sensor 20 disposed on the first surface 11 so as to cover the opening 13 of the base plate 10, the pressure sensor outputting an electric signal according to a pressure of measured fluid inside the opening 13; lead terminals 30 electrically connected to the pressure sensor 20; a housing 40 that holds the base plate 10 and the lead terminals 30, the housing including exposed portions 41 in which portions of the lead terminals 30 are exposed; and capacitors 50 that protect the pressure sensor 20. The housing 40 includes capacitor housing portions 42 in which the capacitors 50 are mountable, the capacitors 50 that have been mounted being electrically connected to the lead terminals 30 inside the exposed portions 41, and positioning portions 60 that position, inside the capacitor housing portions 42, the capacitors 50 that have been mounted in the capacitor housing portions 42.

As illustrated in FIGS. 1 to 6, the pressure detection apparatus 100 according to the present embodiment includes the base plate 10, the pressure sensor 20, the lead terminals 30, the housing 40, the capacitors 50, and the positioning portions 60.

The housing 40 is configured so as to include a housing main body 43 that is positioned at a middle portion and that is formed to have a substantially cylindrical shape, the exposed portions 41 and the capacitor housing portions 42 that are each substantially rectangular and that protrude obliquely to both sides from the middle portion of the housing main body 43 so as to be positioned on an outer side, and fixing portions 44 that are fixed to an attached object and that protrude to both the left and right sides from the middle portion of the housing main body 43 so as to be positioned on the outer side, and the housing main body 43 is provided with a lid member 45.

Regarding the housing 40, the exposed portions 41, the capacitor housing portions 42, the housing main body 43, and the fixing portions 44 are fixed to the attached object are integrally formed of resin such as, for example, poly phenylene sulfide (PPS) resin that has an electric insulation property.

The housing main body 43 houses the base plate 10, the pressure sensor 20, and the lead terminals 30.

The exposed portions 41 are each formed at a distal end portion in a direction distancing away from a middle portion of the housing main body 43. A back surface side of each exposed portion 41 in a central axis direction of the housing main body 43 (a vertical direction extending from the first surface 11 towards the second surface 12 of the base plate 10) is open, and a portion of each lead terminal 30 housed in the housing main body 43 is exposed.

The capacitor housing portions 42 house capacitor main bodies 51 of the capacitors 50, and lead portions 52 of the capacitors 50 are exposed in the exposed portions 41 that are in communication with the capacitor housing portions 42.

In other words, a portion of the capacitor housing portion 42 constitutes the exposed portion 41, and the lead portion 52 of each capacitor 50 housed in the corresponding capacitor housing portion 42 is exposed in the corresponding exposed portion 41.

The distal end side of each capacitor housing portion 42 in a direction distancing away from the opening 13 at the middle portion of the base plate 10 is open forming an insertion port 47 of the capacitor 50, and peripheral three sides other than that of the insertion port 47 are surrounded by wall surfaces. Similar to the exposed portions 41, a back surface side of each capacitor housing portion 42 in the central axis direction of the housing main body 43 (the vertical direction extending from the first surface 11 towards the second surface 12 of the base plate 10) is open.

In other words, in a front-back direction of the housing main body 43 (the vertical direction, for example) in each capacitor housing portion 42, the back surface side is open, and on a plane orthogonal to the front-back direction (on a horizontal plane, for example), the distal end side in a direction distancing away from a middle of the base plate 10 is open as the insertion port 47 and is a space in which the peripheral except for the insertion port 47 is surrounded by wall surfaces.

With the above, the capacitors 50 can be mounted in the capacitor housing portions 42 from lateral sides (the outer side) by being slid from the insertion ports 47 towards a middle side (an inner side).

The housing 40 includes the fixing portions 44 for attaching to the attached object.

The fixing portion 44 that is fixed to the attached object is disposed on both the left and right sides of the housing main body 43 and an attaching hole is formed therein, and is a portion for attaching the pressure detection apparatus 100 to the attached object that is a detected body. The fixing portions 44 are reinforced by attaching metal collars 46 to the attaching holes. By disposing the fixing portion 44 that is fixed to the attached object on both sides of the housing main body 43, even when the attached object is a disciform detected body, the pressure detection apparatus 100 can be attached along the outer peripheral edge portion thereof.

In the present embodiment, the base plate 10 and the lead terminals 30 are insert molded in the housing main body 43, and the metal collars 46 such as, for example, brass, are insert molded in the fixing portions 44 that are fixed to the attached object.

The lid member 45 is a member for setting a side (a first surface 11 side of the base plate 10) opposite to a measured fluid side of the housing main body 43 to an airtight state. The lid member 45 covers the back surface of the surface of the pressure sensor 20 of the housing main body 43, which receives a pressure of the measured fluid, and forms a hermetic space that is a pressure reference chamber A. The lid member 45 is, for example, formed of resin such as PPS that is the same material as that of the housing 40, and is fixed by, for example, laser welding while being in a sealed state with respect to the housing main body 43. The base plate 10 is a metal member that supports the pressure sensor 20 and is formed of a metal material such as, for example, a 42 alloy. The base plate 10 includes the first surface 11 and the second surface 12 that is a back surface of the first surface 11 in the vertical direction, and includes the opening (a pressure introduction port) 13 in the middle portion through which the measured fluid such as hydraulic oil or the like flows. The base plate 10 is integrally molded in a hat shape that includes, in the middle portion thereof, a disciform main body portion 10a including the opening 13, and an annular portion 10b that is continuous with the circumference of the main body portion 10a with a step portion interposed in between and that comes in contact with the attached object. An annular distal end surface of the annular portion 10b constitutes a contact surface 10c.

The base plate 10 is fixed to the housing 40 in an airtight state by, for example, insert molding so that an outer surface formed in the hat shape with the main body portion 10a and the annular portion 10b is embedded in the housing main body 43.

With the above, when the pressure detection apparatus 100 is attached to the attached object, which is the detected body, through the fixing portions 44, the contact surface 10c of the annular portion 10b embedded in the housing main body 43 is fixed so as to come in contact with the attached object.

Note that since the base plate 10 supports the pressure sensor 20, a strength that does not allow distortion to occur in the base plate 10 with the pressure of the measured fluid is obtained therein.

The pressure sensor 20 is constituted by a semiconductor pressure sensor formed as a single chip. The pressure sensor 20 is constituted by anodic bonding a silicon wafer on a glass pedestal (a first insulating layer) 21. The pressure sensor 20 is configured to output strain resistance on the bridge circuit formed in the silicon wafer, which has been converted into a voltage with the change in the pressure. The pressure sensor 20 is configured so that a supply and an output of a voltage is performed with the lead terminals 30 described later. The pressure sensor 20 covers the opening 13 of the base plate 10 and is disposed on the first surface 11 of the base plate 10. The pedestal 21 is fixed in an airtight state with a die bond.

With the above, the pressure of the measured fluid such as hydraulic oil is applied to the pressure sensor 20 through the opening 13.

Each of the lead terminals 30 is insert molded in the housing 40 in an airtight manner, and a first end is electrically connected to the pressure sensor 20 inside the housing main body 43 with a length of wire 31 and a second end protrudes and is exposed in the exposed portion 41 of the distal end portion on each side in a direction distancing away from the middle portion of the housing main body 43. The lead terminals 30 are configured to include a lead terminal for power supply, a lead terminal for grounding, and a lead terminal for output. Each length of wire 31 connecting the pressure sensor 20 and the lead terminal 30 to each other is configured of a length of aluminum wire, for example. Each of the lead terminals 30 is configured of phosphor bronze plated with nickel (Ni), for example.

In one exposed portion 41, portions of two lead terminals 30, for example, the lead terminal for power supply and the lead terminal for grounding are exposed, and in the other exposed portion 41, portions of two lead terminals 30, for example, the lead terminal for output and the lead terminal for grounding are exposed. Furthermore, a source voltage is applied to the lead terminal for power supply of the lead terminal 30, and when the lead terminal for grounding is grounded, a constant current is supplied, and an output voltage of the bridge circuit equivalent to the distortion of the pressure sensor 20 caused by the pressure of the measured fluid inside the opening 13 is output from the lead terminal for output.

Figure 5:
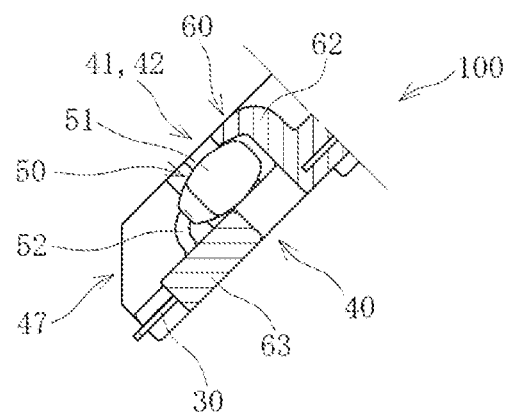
FIG. 5 is a Y-Y cross-sectional view of an exemplary embodiment of the present invention in FIG. 3.
Figure 6:
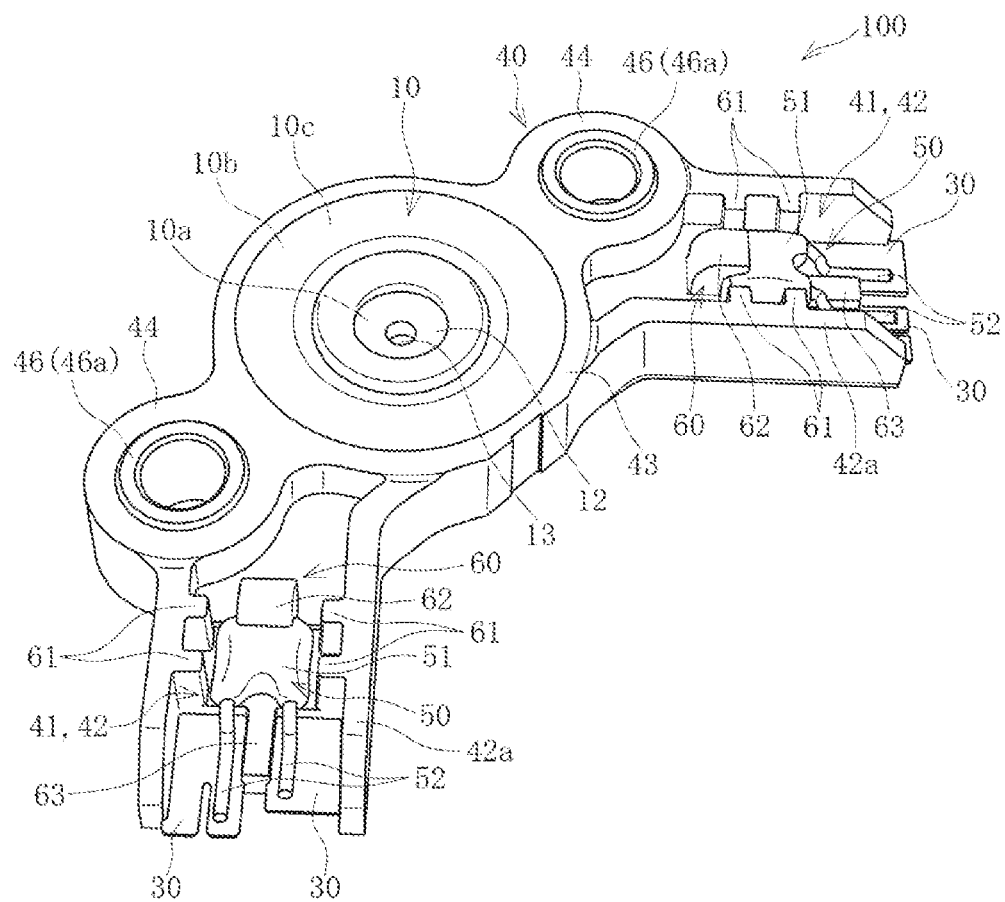
FIG. 6 is a schematic perspective view of an exemplary embodiment of the present invention in which the front and back has been inverted.

The capacitors 50 are for obtaining a yield strength of the pressure sensor 20 of the pressure detection apparatus 100 against exogenous noise, and are configured of chip capacitors, for example. Each capacitor 50 is configured to include the capacitor main body 51 and the lead portions 52 and, as illustrated in FIG. 6, is formed (forming) so that two lead portions 52 are provided so as to extend from the capacitor main body 51 and to protrude in a longitudinal direction of the capacitor main body 51. As illustrated in FIGS. 5 and 6, the capacitor 50 is mounted and housed in the capacitor housing portions 42 of the housing 40 from the lateral side (the outer side) so as to be slid from the insertion port 47 on the distal end side towards the middle side (the inner side) with the capacitor main body 51 at the front and with the lead portions 52 at the back. With the above, the capacitor 50 is housed so that portions of the lead terminals 30 exposed in the exposed portion 41 in communication with the capacitor housing portion 42, and the lead portions 52 are in contact with each other at the back side.

The capacitor main bodies 51 are each positioned inside the corresponding capacitor housing portion 42 with the corresponding positioning portion 60.

Figure 3:
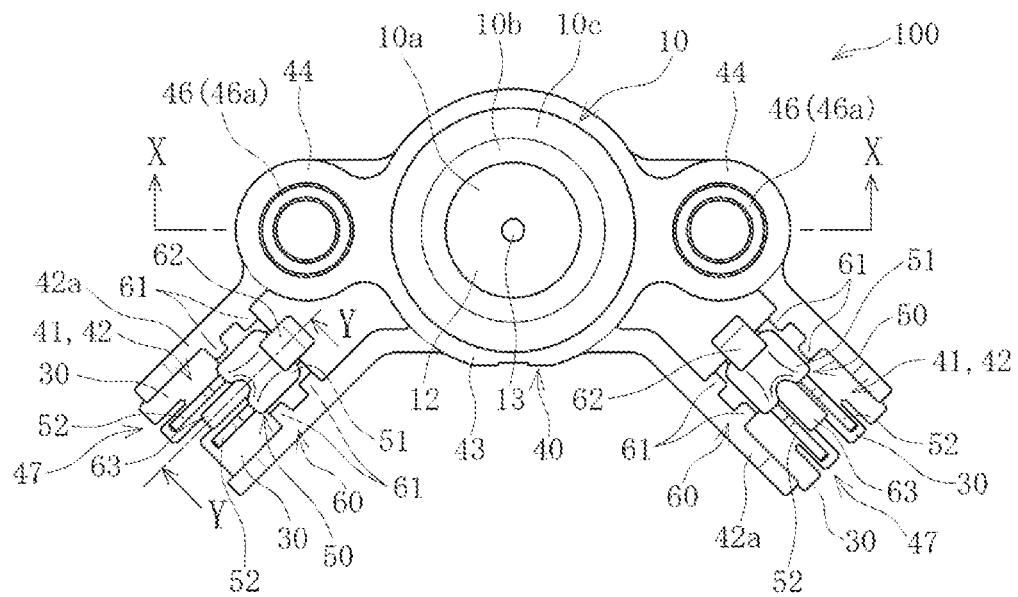
FIG. 3 is a bottom view of an exemplary embodiment of the present invention.
Figure 4:
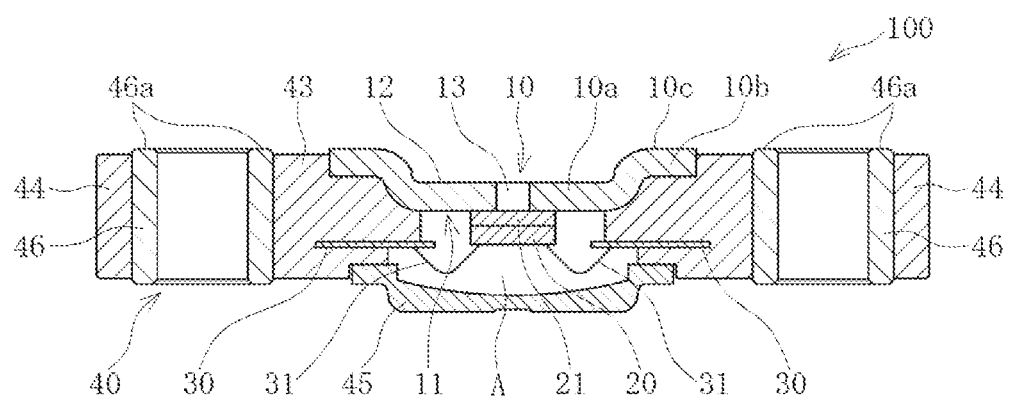
FIG. 4 is an X-X cross-sectional view of an exemplary embodiment of the present invention in FIG. 3.

As illustrated in FIGS. 3 and 6, the positioning portion 60 includes first positioning portions 61 that hold the capacitor 50 in between from a direction (a substantially circumferential direction) orthogonal to a direction (substantially a radiation direction from the middle of the base plate 10 and on a horizontal plane parallel to the drawing surface of FIG. 3: an insertion direction of the capacitor 50) in which the lead terminals 30 extend, and the position of the capacitor main body 51 of the capacitor 50 in the horizontal direction is set so as to hold thereof in between from both sides on a horizontal plane that is parallel to the drawing surface of FIG. 3.

The first positioning portions 61 are formed at two portions in each of the sides so that the capacitor main body 51 can be positioned reliably. Furthermore, by resin molding the first positioning portions 61 parallel to substantially the radiation direction and with a gap in between, positioning can be performed while suppressing an influence of a decrease in accuracy caused by shrinkage during the molding of the first positioning portions 61.

The positioning portion 60 includes a second positioning portion 62. The second positioning portion 62 is, regarding the capacitor 50, positioned above the capacitor 50 in a vertical direction (an up-down direction, for example) that is orthogonal to the horizontal plane parallel to the drawing surface of FIG. 3, sets the position of the capacitor 50 in the vertical direction, and sets the distal end of the capacitor 50 in an up-down position that is vertical to the drawing surface of FIG. 3.

The second positioning portion 62 is formed in a hook shape formed so as to protrude in the vertical direction of the drawing surface of FIG. 3 from a bottom portion of the capacitor housing portion 42 on the front side towards the back side, and so that the distal end portion is slightly bent towards the outer side of the substantially radial direction with respect to the middle of the base plate 10.

With the above, when the capacitor 50 is inserted from the lateral side towards the inner side through the insertion port 47 of the capacitor housing portion 42, the position in the insertion direction is set by the distal end of the capacitor main body 51 abutting against the second positioning portion 62, and the position in the vertical direction is set by restricting the top and bottom of the distal end portion.

In the capacitor 50 in which the positions of the two sides and the distal end thereof on the horizontal plane, and the top and bottom in the vertical direction have been set inside the capacitor housing portion 42 with the positioning portion 60, the lead portions 52 and the lead terminals 30 are in contact with each other in the exposed portion 41 and are electrically bonded to each other by welding or the like. In other words, in one exposed portion 41, the two lead portions 52 of the capacitor 50 are bonded between the lead terminal 30 for power supply and the lead terminal 30 for grounding, and in the other exposed portion 41, the two lead portions 52 of the capacitor 50 are bonded between the lead terminal 30 for output and the lead terminal 30 for grounding so as to obtain yield strength against exogenous noise. Note that the above-described positioning directions of the capacitors 50 with the positioning portions 60 are directions for the sake of description and do not define whatsoever the attaching direction of the pressure detection apparatus 100.

Furthermore, in the pressure detection apparatus 100, in order to increase the insulation property between the two lead portions 52 of the capacitor 50, an insulating portion 63 positioned between the lead portions 52 is formed so as to protrude from the front side towards the back side of the capacitor housing portion 42.

By having the above insulating portion 63 protrude between the lead terminals 30 as well, the insulation property between the lead terminals 30 and the insulation property of the lead portions 52 of the capacitors 50 are improved.

In the pressure detection apparatus 100 configured in the above manner, since the portions of the lead terminals 30 that are provided by insert molding in the housing 40 are exposed in the exposed portion 41, and the lead portions 52 of the capacitor 50 housed through the insertion port 47 of the capacitor housing portion 42 are disposed and are bonded to the exposed lead terminals 30, there is no need to, as it has been done hitherto, house the circuit board inside the housing 40 and bond the capacitors 50 through the circuit board, and even when capacitors 50 that obtain the yield strength against exogenous noise are provided, the housing 40 can be made compact and the pressure detection apparatus 100 itself can be reduced in size.

The pressure detection apparatus 100 having the configuration described above is used by being housed in a case body 230 of a detected body such as an electric hydraulic pump 200 that is the attached object, for example.

Figure 9:
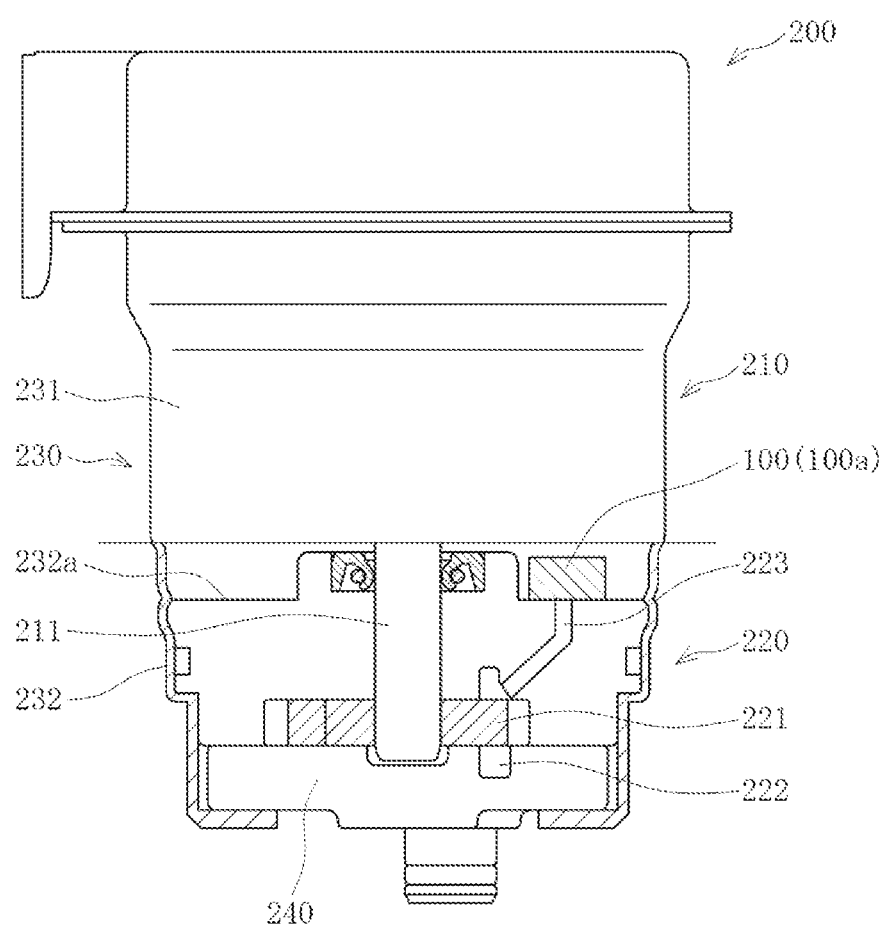
FIG. 9 is a local sectional view of an exemplary embodiment of an electric hydraulic pump that houses a pressure detection apparatus of an exemplary embodiment of the present invention.

The electric hydraulic pump 200 housing the pressure detection apparatus is, for example, as illustrated in FIG. 9, configured to include a motor 210 including a rotating shaft 211, a pump body 220 driven by the motor 210, the case body 230 that accommodates (houses) the motor 210, the pump body 220, and the pressure detection apparatus 100.

In the motor 210, the rotating shaft 211 is connected to a rotor that rotates on a central axis of a ring-shaped stator (not shown), and the rotating shaft 211 is disposed so as to protrude inside the pump body 220 from a motor case 231 constituting the case body 230.

The pump body 220 includes a pump rotor 221, is connected to the rotating shaft 211 of the motor 210, and is rotationally driven. The pump body 220 is accommodated (housed) inside a pump case 232 constituting the case body 230. The pump body 220 is provided with a sensor flow path 223 in communication with a discharge port 222, and a first end of the sensor flow path 223 is provided so as to be open in an opposing surface 232a of the pump case 232 that opposes the motor 210.

The pump body 220 is covered with a pump cover 240 provided on the opposite side of the motor 210.

The pressure detection apparatus 100 is fixed to the opposing surface 232a of the pump body 220 that opposes the motor 210, a seal material (not shown) is mounted on the annular portion 10b of the base plate 10 so that the measured fluid acts on the opening 13 of the base plate 10 through the flow path 223, and the contact surface 10c is made to come in contact with the opposing surface 232a and is fixed in a hermetic state. The pressure detection apparatus 100 is fixed to the opposing surface 232a of the case body 230 with bolts (not shown) inserted through the metal collars 46 of the fixing portions 44 for attaching.

In the pressure detection apparatus 100, the pressure sensor 20 becomes distorted (deformed) according to the difference between the pressure of the measured fluid acting on the opening 13 and a pressure (a reference pressure) of the fluid (atmosphere) inside the pressure reference chamber A that is on the back side of the pressure sensor 20 and that is sealed by the lid member 45. The resistance value of the bridge circuit changes in accordance with the above distortion (deformation) the output voltage changes. The above change in the output voltage is output as a measurement signal to the lead terminal 30 for output. In other words, the pressure sensor 20 outputs a voltage signal corresponding to the pressure of the measured fluid.

The electric hydraulic pump 200 in which such a pressure detection apparatus 100 is housed is capable of reducing the number of components and size.

Subsequently, in such a pressure detection apparatus 100, since there will be a problem in the measurement accuracy if the base plate 10 is not fixed to the detected body in a hermetic state when the pressure is detected, sealing performance needs to be improved.

Figure 7:
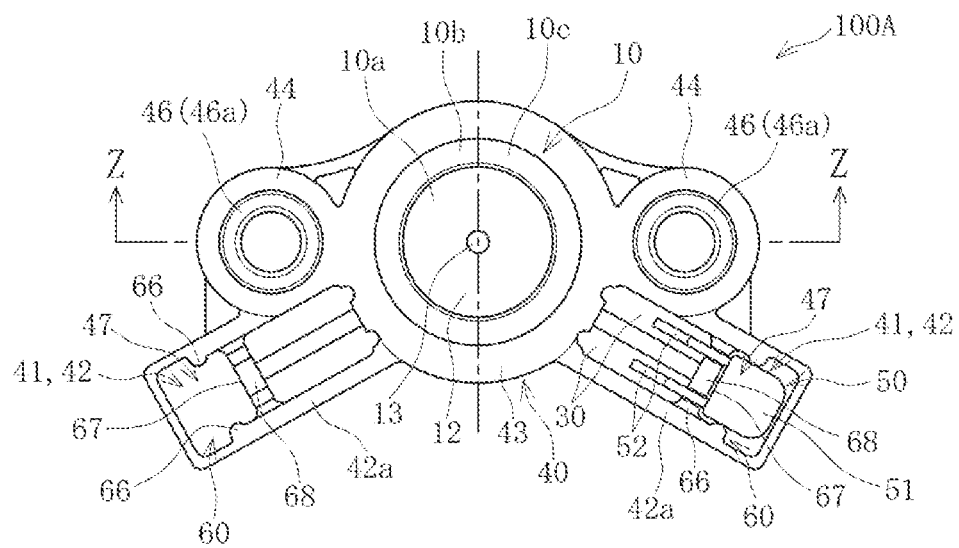
FIG. 7 is a bottom view of another exemplary embodiment of the present invention.
Figure 8:
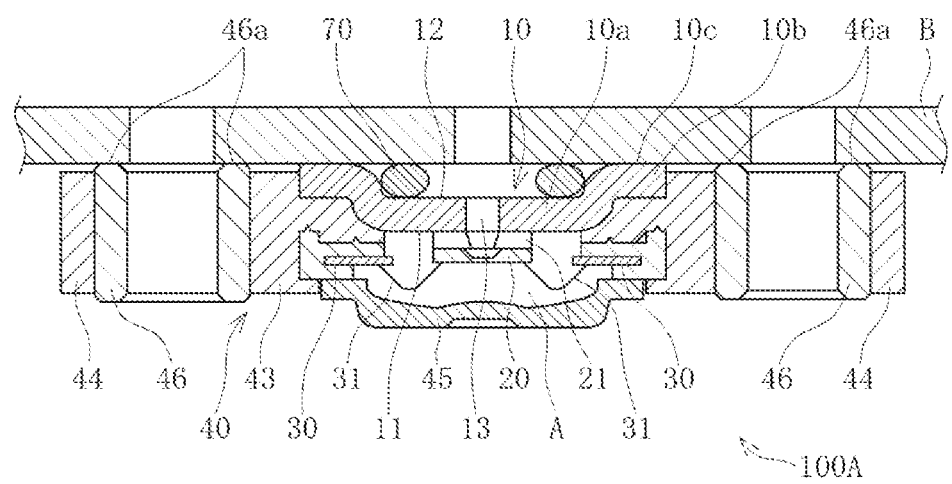
FIG. 8 is a Z-Z cross-sectional view of the exemplary embodiment of the present invention in FIG. 7.

Accordingly, in a pressure detection apparatus 100A, as illustrated in FIGS. 7 and 8, the pressure detection apparatus 100A includes a base plate 10 including a first surface 11, a second surface 12 positioned on a back side of the first surface 11 in a vertical direction, and an opening 13; a pressure sensor 20 disposed on the first surface 11 so as to cover the opening 13 of the base plate 10, the pressure sensor outputting an electric signal according to a pressure of measured fluid inside the opening 13; lead terminals 30 electrically connected to the pressure sensor 20; a housing 40 that holds the base plate 10 and the lead terminals 30, the housing including exposed portions 41 in which portions of the lead terminals 30 are exposed; and capacitors 50 that protect the pressure sensor 20. The base plate 10 includes a contact surface 10c that comes in contact with an attached object B to which the pressure detection apparatus 100A is attached, and a sealing member 70 that is formed so as to surround the outer periphery of the opening 13 and that, in a state in which the contact surface 10c of the base plate 10 is in contact with the attached object B, seals between the contact surface 10c of the base plate 10 and the attached object B. The housing 40 is disposed lower than and on the pressure sensor 20 side with respect to the contact surface 10c.

Furthermore, in the pressure detection apparatus 100A, the housing 40 includes a plurality of collars 46 in which attaching holes that attach the housing 40 to the attached object B are formed. The collars 46 are configured so as to be disposed at a height that is the same as that of the contact surface 10c, or lower than and on the pressure sensor 20 side with respect to the contact surface 10c. In other words, sealing in which the sealing member 70 is squashed to a compressed state is performed by tightening until the sealing member 70 mounted on the annular portion 10b of the base plate 10 comes in contact with the detected body, which is the attached object B, and until the contact surface 10c of the base plate 10 contact the detected body, which is the attached object B.

When obtaining the above sealed state, if the hosing 40 comes in contact before the contact surface 10c of the base plate 10, or when the metal collars 46 of the fixing portions 44 for the attached object B contact the detected body first, the base plate 10 cannot be tightened further from the above state and the sealing member 70 cannot be squashed into the compressed state.

Accordingly, in the pressure detection apparatus 100A, the contact surface 10c of the base plate 10 is configured to be lower than the housing 40, and the metal collars 46 of the fixing portions 44 is, in a similar manner, configured to be lower than the housing 40.

By so doing, the sealing member 70 is capable of obtaining and maintaining the compressed state between the detected body, which is the attached object B, and the base plate 10, and the pressure of the pressure fluid in the hermetic state can be detected with high accuracy.

Figure 2:
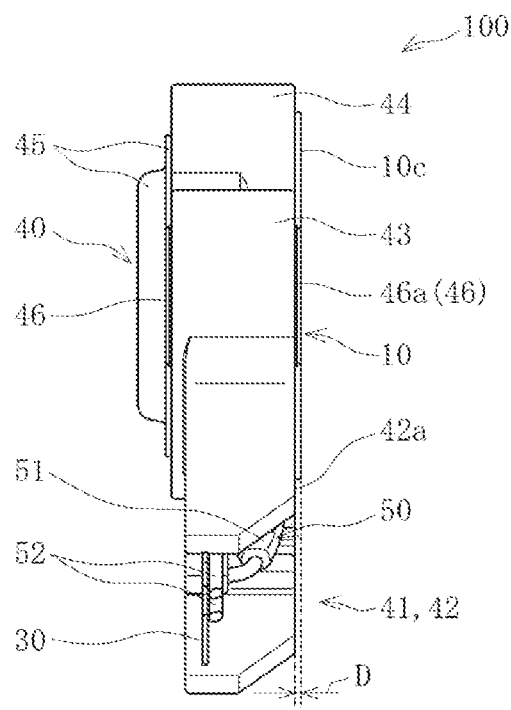
FIG. 2 is a left side view of an exemplary embodiment of the present invention.

Furthermore, for example, as illustrated in FIG. 2, in the pressure detection apparatuses 100 and 100A, surfaces 46a of the collars 46 in contact with the attached object B are formed so as to protrude towards the attached object B side with respect to a surface 42a in the capacitor housing portion 42 opposing the attached object B, and when fixed to the attached object B having a smooth surface using the collars 46, a clearance D can be provided between the opposing surfaces 42a and the attached object B. Owing to the clearance D, a structure in which the opposing surface 42a and the attached object B do not come in contact with each other even when the capacitor housing portions 42 vibrate due to driving of the vehicle can be provided without making the structure of the attached object B complex. Accordingly, an effect of preventing abnormal noise and the like from occurring can be obtained even with a structure provided with the capacitor housing portions 42 outside the two collars 46 and 46, which are portions for fixing the attached object B.

Furthermore, as illustrated in FIG. 7, in the pressure detection apparatus 100A, the capacitor housing portions 42 are open towards the back surface side of the housing 40 (on the side from the first surface 11 of the base plate 10 towards the second surface 12 in a direction vertical to the first surface 11), and portions of the opening constitute the exposed portions 41 of the lead terminals 30. The exposed portions 41 is configured so as to be in communication with the capacitor housing portions 42, and the entire circumferences of the capacitor housing portions 42 are surrounded by the wall surfaces. Portions of the lead terminals 30 embedded in the housing main body 43 are exposed in the exposed portions 41. The capacitors 50 are mounted and housed in the capacitor housing portions 42 from the back surface side towards the front side in a direction vertical to the first surface 11 of the base plate 10. The capacitor main bodies 51 are disposed on the outer side with respect to the middle side and the lead portions 52 are disposed on the middle side, and the capacitors 50 are housed inside the capacitor housing portions 42 in a direction (an up-down direction) vertical to the first surface 11 of the base plate 10.

The positioning portions 60 are provided inside the capacitor housing portions 42 and set the positions of the housed capacitors 50. As illustrated in FIG. 7, each positioning portion 60 is configured to include first positioning portions 66 that set the position of the capacitor main body 51 in the left-right direction by, on the horizontal plane parallel to the drawing surface of FIG. 7, holding from both sides with respect to substantially a radiation direction from the middle of the base plate 10; a second positioning portion 67 that sets the position in the front-back direction by, on the horizontal plane parallel to the drawing surface of FIG. 7, holding down the middle side of the capacitor main body 51 together with the wall surfaces of the capacitor housing portion 42 on the outer side; and an insulating portion 68 that performs insulation and sets the position in the left-right direction by having the lead portions 52 of the capacitors 50 be positioned inside a groove and, on the horizontal plane parallel to the drawing surface of FIG. 7, be held from both sides with respect to substantially the radiation direction from the middle of the base plate 10. The insulating portion 68 being positioned between the two lead portions 52 not only contributes to insulation but also contributes to positioning of the lead portions 52.

Note that by attaching the pressure detection apparatus 100A to the detected body, which is the attached object B, the exposed portions 41 open at the back surfaces of the capacitor housing portions 42 are closed by the detected body, which is the attached object B, and the housed state of the capacitors 50 is obtained.

Note that the above-described positioning directions of the capacitors 50 with the positioning portions 60 are directions for the sake of description and do not define whatsoever the attaching direction of the pressure detection apparatus 100A.

The lead portions 52 of the capacitors 50 positioned inside the capacitor housing portions 42 with the positioning portions 60 are housed in a connected state with the lead terminals 30 that have portions thereof exposed in the exposed portions 41. In the exposed portions 41, the lead portions 52 of the capacitors 50 and the lead terminals 30 are electrically connected to each other by welding or the like.

In the pressure detection apparatus 100A, the capacitors 50 are housed in the capacitor housing portions 42 from the back side towards the front side; however, not limited to the above, as in the case of the pressure detection apparatus 100, insertion may be performed by sliding from the lateral side towards the inner side as long as the contact surface 10*c* of the base plate 10 comes into contact with the attached object B and sealing can be performed with the sealing member 70 in the compressed state.

According to such a pressure detection apparatus 100A, the pressure detection apparatus 100A includes a base plate 10 including a first surface 11, a second surface 12 positioned on a back side of the first surface 11 in a vertical direction, and an opening 13; a pressure sensor 20 disposed on the first surface 11 so as to cover the opening 13 of the base plate 10, the pressure sensor outputting an electric signal according to a pressure of measured fluid inside the opening 13; lead terminals 30 electrically connected to the pressure sensor 20; a housing 40 that holds the base plate 10 and the lead terminals 30, the housing including exposed portions 41 in which portions of the lead terminals 30 are exposed; and capacitors 50 that protect the pressure sensor 20. The base plate 10 includes a contact surface 10*c* that comes in contact with an attached object B to which the pressure detection apparatus 100A is attached, and a sealing member 70 that is formed so as to surround the outer periphery of the opening 13 and that, in a state in which the contact surface 10*c* of the base plate 10 is in contact with the attached object B, seals between the contact surface 10*c* of the base plate 10 and the attached object B. Since the housing 40 is configured so as to be disposed at a height that is the same as that of the contact surface 10*c* or lower than and on the pressure sensor 20 side with respect to the contact surface 10*c*, the sealing member 70 is capable of obtaining and maintaining the compressed state between the attached object B and the base plate 10, and the pressure of the pressure fluid in the hermetic state can be detected with high accuracy.

Furthermore, according to the pressure detection apparatus 100A, since the housing 40 includes a plurality of collars 46 in which attaching holes that attach the housing 40 to the attached object B are formed and since the collars 46 are configured so as to be disposed at a height that is the same as that of the contact surface 10*c*, or lower than and on the pressure sensor 20 side with respect to the contact surface 10*c*, the sealing member 70 is capable of obtaining and maintaining the compressed state between the attached object B and the base plate 10 without the collars 46 contacting the attached object B before the contact surface 10*c*, and the pressure of the pressure fluid in the hermetic state can be detected with high accuracy.

Similar to the pressure detection apparatus 100, for example, as illustrated in FIG. 9, the pressure detection apparatus 100A is used while being housed inside the case body 230 of the electric hydraulic pump 200. With the above, the electric hydraulic pump 200 in which such a pressure detection apparatus 100A is housed is capable of reducing the number of components and size.

As specifically described above together with the embodiments, the pressure detection apparatus 100 of the present disclosure is configured to include the base plate 10 including the first surface 11, the second surface 12 positioned on the back side of the first surface 11 in the vertical direction, and the opening 13; the pressure sensor 20 disposed on the first surface 11 so as to cover the opening 13 of the base plate 10, the pressure sensor outputting an electric signal according to the pressure of the measured fluid inside the opening 13; the lead terminals 30 electrically connected to the pressure sensor 20; the housing 40 that holds the base plate 10 and the lead terminals 30, the housing including the exposed portions 41 in which the portions of the lead terminals 30 are exposed; and the capacitors 50 that protect the pressure sensor 20, in which the housing 40 includes the capacitor housing portions 42 in which the capacitors 50 are mountable, the capacitors 50 that have been mounted being electrically connected to the lead terminals 30 inside the exposed portions 41, and the positioning portions 60 that position, inside the capacitor housing portions 42, the capacitors 50 that have been mounted in the capacitor housing portions 42; accordingly, the capacitors 50 can be housed and positioned inside the capacitor housing portions 42 with the positioning portions 60 without using circuit boards, and the yield strength against exogenous noise can be obtained. Furthermore, the number of parts can be reduced and the size can be reduced. Furthermore, the lead terminals 30 and the capacitors 50 can be electrically connected to each other easily in the exposed portions 41.

According to the pressure detection apparatus 100 of the present disclosure, the lead terminals 30 extend to the outer side of the base plate 10 in a direction distancing away from the central axis of the opening 13, the positioning portions 60 include the first positioning portions 61 that hold the capacitors 50 in between in the direction intersecting the direction in which the lead terminals 30 extend, and the housing 40 includes the insertion portions 47 that are open in the capacitor housing portions 42 towards the distal end sides of the lead terminals 30 and that allow the capacitors 50 to be installed and uninstalled from the lateral sides towards the inner sides; accordingly, by sliding the capacitors 50 from the insertion ports 47 and have both sides of the capacitors 50 be held between the first positioning portions 61, insertion into the capacitor housing portions 42 from the lateral sides towards the inner sides, positioning, and housing can be performed.

According to the pressure detection apparatus 100 of the present disclosure, the positioning portions 60 are positioned above the capacitors 50 in the directions orthogonal to the directions in which the first positioning portions 61 hold the capacitors 50 in between, and the second positioning portion 62 that determine the positions of the capacitors 50 are included; accordingly, positioning can be performed not only in the directions holding the capacitors 50 in between but also in the directions orthogonal to the above with the second positioning portion 62, and the capacitors 50 can be positioned in a further reliable manner and be housed inside the capacitor housing portions 42.

According to the pressure detection apparatus 100 of the present disclosure, the capacitors 50 include the capacitor main bodies 51 and pairs of lead portions 52, the capacitor housing portions 42 include insulating portions 63 that are each positioned between the corresponding pair of lead portions 52 and that each insulate the corresponding pair of lead portions from each other; accordingly, contact between the pair of lead portions 52 can be physically prevented with the insulating portion 63, and the insulation property can be improved.

According to the pressure detection apparatus 100 of the present disclosure, the housing 40 is provided with the lid member 45 that forms the hermetic pressure reference chamber A that covers the back surface of the surface of the pressure sensor 20 that receives the pressure of the measured fluid; accordingly, the change in pressure with respect to the reference pressure can be detected with the pressure reference chamber A.

The electric hydraulic pump of the present disclosure that each house the pressure detection apparatuses 100 or 100A each include the motor 210 including the rotating shaft 211, the pump body 220 that is driven with the motor 210, the pressure detection apparatus 100 or 100A according to any one of Claims 1 to 5 that is in communication with the sensor flow path 223 of the pump body 220 and that is fixed to the pump body, and the case body 230 that houses the motor 210, the pump body 220, and the pressure detection apparatus 100 or 100A; accordingly, the number of parts can be reduced and the size can be reduced.

Note that in the embodiments described above, the pressure sensor of a single chip semiconductor type has been described as an example of the pressure sensor; however, the configuration of the pressure sensor can be of another type and is optional.

Furthermore, the present invention is not limited to the exemplary embodiments described above in any way.

Features of the above-described preferred embodiments and the modifications thereof may be combined appropriately as long as no conflict arises.

While preferred embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

The invention claimed is:

1. A pressure detection apparatus comprising:
    a base plate including a first surface, and a second surface positioned on a back side of the first surface in a vertical direction, the base plate being provided with an opening;
    a pressure sensor disposed on the first surface so as to cover the opening of the base plate, the pressure sensor outputting an electric signal according to a pressure of measured fluid inside the opening;
    a lead terminal electrically connected to the pressure sensor;
    a housing that holds the base plate and the lead terminal, the housing including an exposed portion in which a portion of the lead terminal is exposed; and
    a capacitor that protects the pressure sensor; wherein
    the housing includes a capacitor housing portion in which the capacitor is mountable, the capacitor that has been mounted being electrically connected to the lead terminal inside the exposed portion, and a positioning portion that positions, inside the capacitor housing portion, the capacitor that has been mounted in the capacitor housing portion.

2. The pressure detection apparatus according to claim 1, wherein
    the lead terminal extends to an outer side of the base plate in a direction spaced away from a central axis of the opening;
    the positioning portion includes a first positioning portion that holds the capacitor in between in a direction intersecting a direction in which the lead terminal extends; and
    the housing includes an insertion port open in the capacitor housing portion towards a distal end side of the lead terminal, the insertion port allowing the capacitor to be installed and uninstalled from a lateral side towards an inner side.

3. The pressure detection apparatus according to claim 2, wherein the positioning portion includes a second positioning portion positioned above the capacitor in a direction perpendicular or substantially perpendicular to a direction in which the first positioning portion holds the capacitor in between, the second positioning portion determining a position of the capacitor.

4. The pressure detection apparatus according to claim 1, wherein
   the capacitor includes a capacitor main body and a pair of lead portions; and
   the capacitor housing portion includes an insulating portion that is positioned between the pair of lead portions and that insulates the pair of lead portions from each other.

5. The pressure detection apparatus according to claim 1, wherein the housing includes a lid member that covers a back surface of a surface of the pressure sensor receiving the pressure of the measured fluid and that forms a hermetic pressure reference chamber.

6. An electric hydraulic pump that houses a pressure detection apparatus, the electric hydraulic pump comprising:
   a motor including a rotating shaft;
   a pump body driven by the motor;
   the pressure detection apparatus according to claim 1 that is in communication with a sensor flow path of the pump body and that is fixed to the pump body; and
   a case body that houses the motor, the pump body, and the pressure detection apparatus.

\* \* \* \* \*